United States Patent [19]
Caldwell et al.

[11] Patent Number: 4,546,268
[45] Date of Patent: Oct. 8, 1985

[54] NARROW PULSEWIDTH PULSE GENERATOR CIRCUIT UTILIZING NPN MICROWAVE TRANSISTORS

[75] Inventors: Stephen P. Caldwell, Linthicum; David R. Pedersen, Laurel, both of Md.

[73] Assignee: The United States of America as represented by the Secretary of the Air Force, Washington, D.C.

[21] Appl. No.: 559,561

[22] Filed: Dec. 8, 1983

[51] Int. Cl.⁴ ............................................... H03K 5/07
[52] U.S. Cl. ..................................... 307/265; 307/106; 328/202
[58] Field of Search ................. 307/106, 265; 328/202

[56] References Cited

U.S. PATENT DOCUMENTS

| | | | |
|---|---|---|---|
| 3,109,936 | 11/1963 | Rennie | 307/88 |
| 3,571,628 | 3/1971 | Braun et al. | 307/265 |
| 3,723,756 | 3/1973 | Dahlinger | 307/106 |
| 3,783,304 | 1/1974 | Fox | 307/106 |
| 3,832,572 | 8/1974 | Minamihata et al. | 307/106 |
| 4,238,695 | 12/1980 | Hock | 307/265 |
| 4,379,240 | 4/1983 | Mammand | 307/265 |

*Primary Examiner*—John S. Heyman
*Attorney, Agent, or Firm*—Donald J. Singer; Richard J. Donahue

[57] ABSTRACT

A pulse generator circuit for providing pulses having pulse widths in the order of one nanosecond. The circuitry utilizes NPN microwave transistors exclusively to achieve this result.

7 Claims, 8 Drawing Figures

NARROW PULSEWIDTH PULSE GENERATOR CIRCUIT UTILIZING NPN MICROWAVE TRANSISTORS

STATEMENT OF GOVERNMENT INTEREST

The invention described herein may be manufactured and used by or for the Government for governmental purposes without the payment of any royalty thereon.

BACKGROUND OF THE INVENTION

The present invention concerns a pulse generator circuit for forming very narrow pulses with extremely low jitter or phase noise. More particularly, the pulse generator circuit of the present invention requires only NPN type transistors, such transistors being readily available for use at microwave frequencies.

Sampled phase locked loops require stable local oscillator circuits which are frequency and waveform agile and have low phase noise. The gating pulse of the sampler is used to turn on the diodes of a double balanced mixer and thus gate an RF signal to a load. In such an application, the gate pulse generator must have extremely low noise and jitter characteristics, and provide a moderate current output, say 30 milliamperes.

Pulse generating circuits are presently known which are low noise circuits and provide moderate current output pulses. Examples of such circuits are shown in the drawings herein. However, the generation of narrow width pulses, in the order of one nano-second or less, is precluded by their use of one or more PNP transistors, which are not generally suitable for such high speed switching applications.

SUMMARY OF THE INVENTION

An object of the present invention therefore, is to provide an improved pulse generator circuit capable of generating sub-nanosecond pulses.

In accordance with the present invention, the disclosed circuitry generates such narrow pulses utilizing NPN microwave transistors as a current mode switch to control the energy stored in an associated inductor.

BRIEF DESCRIPTION OF THE DRAWINGS

A better understanding of the invention may be had by reference to the following description, taken in conjunction with the accompanying drawings, in which.

DESCRIPTION OF THE PREFERRED EMBODIMENT

Figure 1:
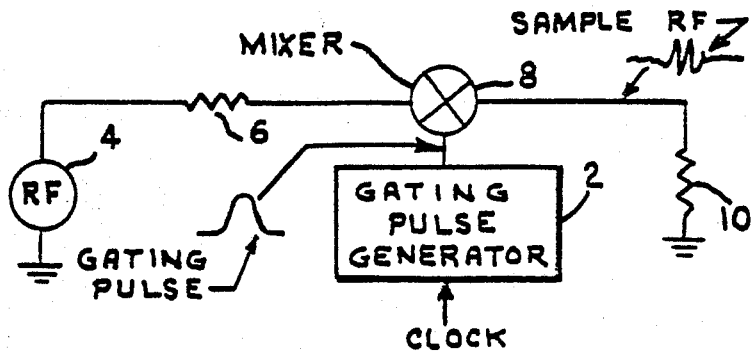
FIG. 1 is a block diagram representation of a typical RF sampler circuit utilizing a gating pulse generator circuit.

Referring now to the drawings, FIG. 1 depicts a typical sampler circuit for RF energy which includes a clocked gating pulse generator 2. RF energy from a source 4 having a source resistance 6 is sampled by gating the diodes of a double balanced mixer 8 and thus gate the RF energy to a load 10. As previously mentioned the gating pulses provided to the sampler must be narrow, low-noise, and have moderate (approximately 30 milliamperes) current output.

Figure 2A:
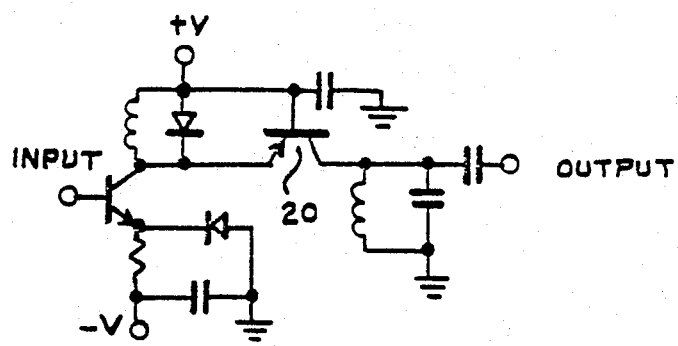
FIGS. 2A and 2B are schematic diagrams of prior art pulse generator circuits.
Figure 2B:
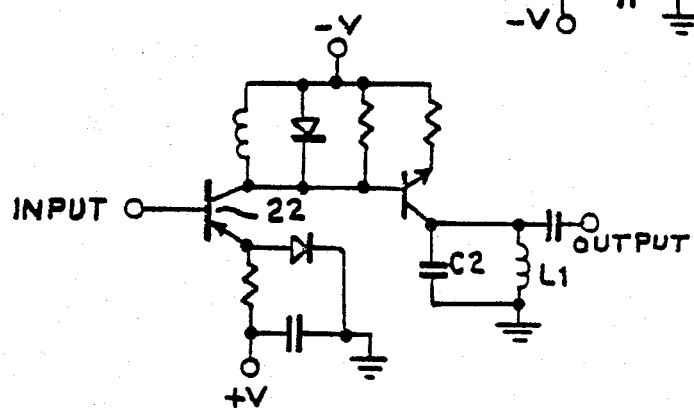

Pulse circuits which are low noise and provide moderate current have been disclosed in the prior art and are shown herein in FIGS. 2A and 2B. The circuit of FIG. 2A has been previously developed at Westinghouse Corporation while the circuit of FIG. 2B was disclosed earlier by Richard A. Baugh at the 1972 Annual Symposium on Frequency Control. The generation of narrow pulses by these circuits is limited by their use of PNP type transistors, such as the transistors 20 and 22.

Figure 3:
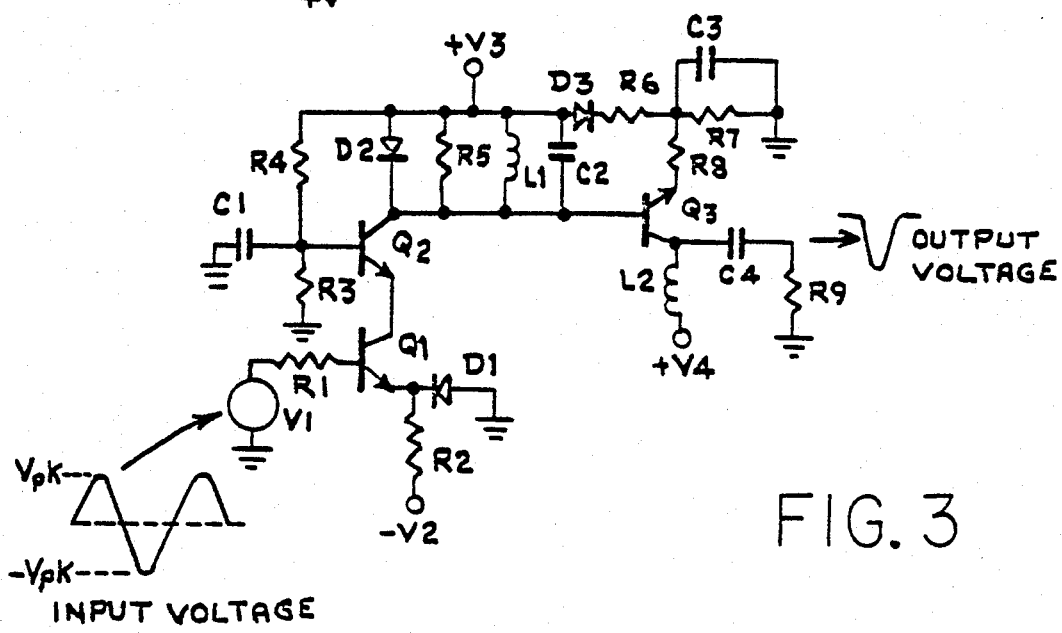
FIG. 3 is a schematic diagram depicting the basic implementation of the pulse generator circuit of the present invention.

The present invention disclosed in its basic form in FIG. 3 uses NPN microwave transistors which are inherently suitable for the generation of narrow pulses. With 7 GHz $f_T$ microwave transistors, sub-nanosecond pulses can be achieved with this circuit.

The pulse generator circuit of the present invention generates a narrow pulse by using a current mode switch to control the energy stored in an inductor. Referring now to the basic circuit configuration shown in FIG. 3, transistors Q1 and Q2 are turned on when input voltage V1 is positive. A steady state current of approximately V2/R2 then flows thru L1, whose stored energy is $(L \cdot i^2)/2 = (L1 \cdot V2^2)/(2 \cdot R2^2)$. When transistors Q1 and Q2 are turned off by the input signal going negative, the current in inductor L1 flows into the base of transistor Q3, turning it on. Transistor Q3 remains on until the energy stored in inductor L1 is dissipated. The amplitude and pulsewidth of the current pulse at the collector of transistor Q3 are determined by the steady state current in inductor L1, the values of L1, capacitor C2, resistor R5, and the base impedance of transistor Q3.

Transistor Q2, diode D3, resistor R6, capacitor C3 and resistor R7 are important for fast switching. Transistor Q2 is common base so that the collector-base capacitance of transistor Q1 does not appear at the base of transistor Q1 as a larger capacitance (the Miller effect). Thus the slew rate of the input waveform is not degraded and subsequently, the switching speed of current mode switch Q1–D1. Diode D3, and resistors R6 and R7 bias transistor Q3 almost on so that little energy is required to turn transistor Q3 on when inductor L1 discharges.

Figure 6:
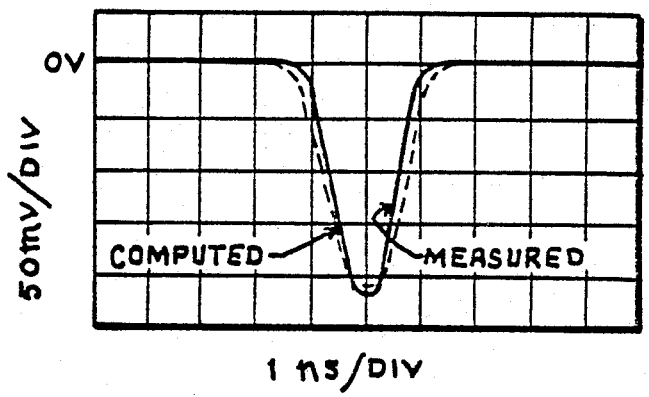
FIG. 6 is a graph depicting the measured and computed output pulse waveform of the present invention.

The design of the circuit for a particular current pulse amplitude and pulsewidth is aided by computer circuit analysis. The output pulsewidth is approximately $\pi\sqrt{L1 \cdot C2}$. This neglects base-emitter capacitance of transistor Q3 which must be considered for narrow pulsewidths. The capacitance, however, is a non-linear function of the transistor's base-emitter voltage so the effect on pulsewidths is difficult to derive. In the past (i.e. in the circuit of FIG. 2B) the values of inductor L1 and capacitor C2 were determined experimentally. Today, circuit analysis computer programs allow modeling of transistors to include their non-linear characteristics, including that of non-linear base-emitter capacitance. The values of inductor L1 and capacitor C2 can thus be determined with the aid of a computer. The value of resistor R5 is also chosen in this procedure for a critically damped inductor current waveform. Furthermore, the entire circuit is easily analyzed using the computer. The SPICE (Simulated Program With Integrated Circuit Emphasis) circuit analysis program was used to analyze the disclosed circuit. Close agreement between computed and measured results have been obtained, as evidenced by the waveforms depicted in FIG. 6. Low pulse jitter or phase noise is achieved mainly by use of the current mode switch (Q1–D1) to initiate the output pulse. The current mode switch is known to have low phase-noise and this property is utilized in the disclosed invention.

Figure 4:
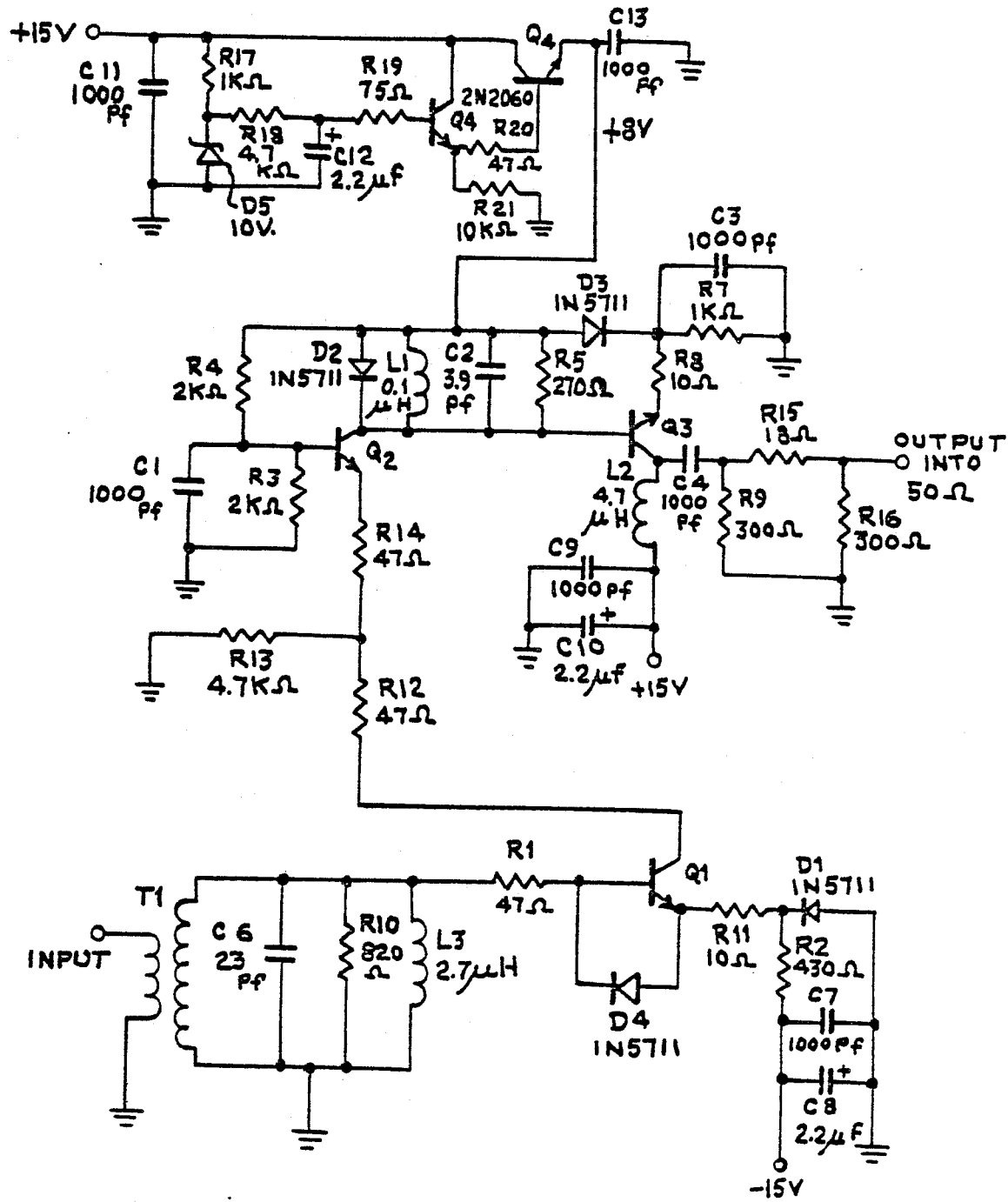
FIG. 4 is a schematic diagram of a specific embodiment of the pulse generator circuit of the present invention, including a regulated power source.
Figure 5:
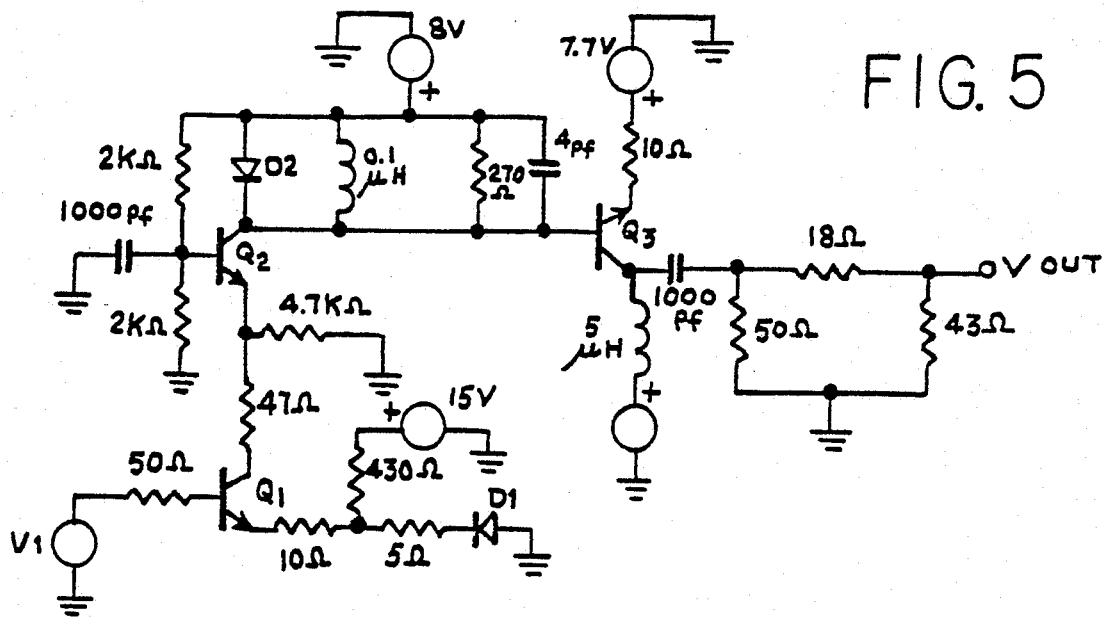
FIG. 5 is a schematic diagram of the equivalent of the pulse generator circuit of the present invention used for computer aided circuit analysis.

A circuit having the specific component parameters noted in FIG. 4 of the drawings was used to obtain experimental data. The circuit was designed for a pulse-width of 1.5 ns and minimum amplitude of 2 volts into a 50 ohm load. FIG. 5 is the equivalent circuit used for computer aided circuit analysis. In the circuit of FIG. 4, transformer T1 steps up the input voltage so that the base drive of transistor Q1 is about 3 volts peak. Resistor R2 sets the steady state current at the collector of transistor Q1 which is the current flowing thru inductor L1. When the input signal turns the current through transistor Q1 off, the current in inductor L1 flows into the base of transistor Q3 turning it on. Inductor L1, capacitor C2, resistor R5, and the base impedance of transistor Q3 determine the output pulsewidth and shape. A 3 db pad on the output simply provides isolation. A 2 volt output corresponds to a 68 milliampere current pulse at the collector of transistor Q3.

The transistors Q1, Q2 and Q3 are each NPN microwave type transistors, and in the circuits disclosed herein are type HXTR 6106 devices manufactured by the Hewlett Packard Company.

Phase noise measurement results for the experimental circuit are as follows:

| Input Frequency | Meas. Noise | −10 log (d) | Inherent Noise |
| --- | --- | --- | --- |
| 15 MHz | −145.3 db/Hz | −13.7 db | −159.0 db/Hz |
| 20 | −151.0 | −12.5 | −163.5 |
| 60 | −157.6 | −8.2 | −165.8 |

Figure 7:
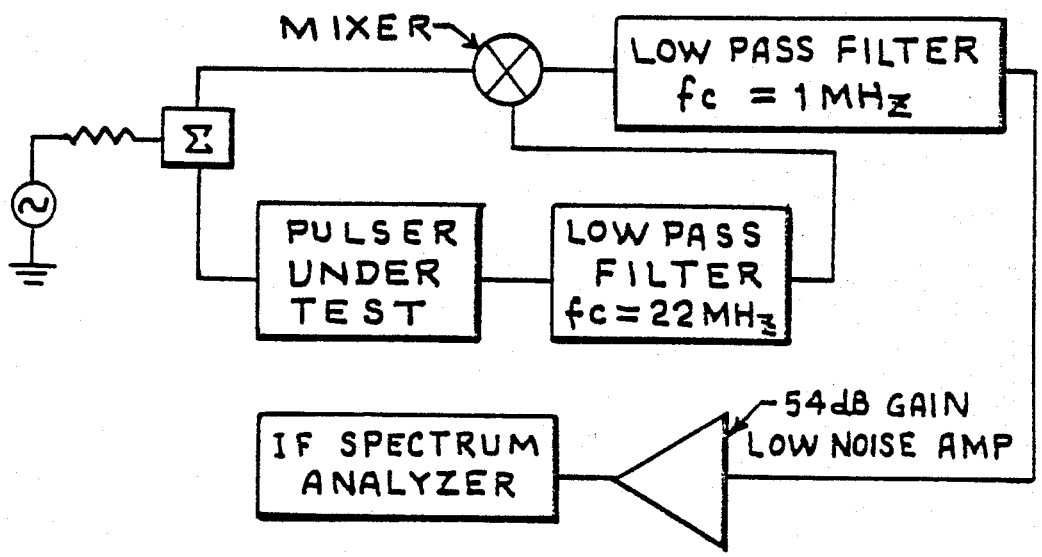
FIG. 7 is a block diagram of the measurement apparatus for determining the phase noise characteristics of the present invention.

The measurement set-up shown in FIG. 7 was used to obtain the results. This set-up differs from the more common multiplier phase bridge where a harmonic of the pulse is band-pass filtered and mixed with the same signal from another pulse circuit in the opposite side of a bridge. The set-up used herein characterized phase noise for use in RF samplers. Therefore, the fundamental frequency component of the pulsed waveform is filtered and applied to the mixer in the phase bridge. The other input to the mixer is the coupled down input signal. Noise thus measured is the additive noise of the pulser circuit.

The measured noise will depend on the duty cycle of the pulsed waveform. This is because the output pulser noise is simply the active circuit element noise gated by the pulse. Thus, the measured phase noise will be the inherent device noise increased by 10 log(d), where d is the duty cycle. It will be note that the inherent device noise improves for higher duty cycle which corresponds to higher input frequency. The greater zero-crossing slew rates of the higher input frequencies improve the stability of input transistor Q1 which reduces noise. Emitter-coupled logic frequency dividers have similar input stages and have the same characteristic.

As mentioned above the intended use for the pulse generator is a driver for an RF sampler. The pulse will turn on the diodes of a double balanced mixer and thus gate an RF signal. Since the measurement set-up of FIG. 7 measures the gated pulse noise, then this will be the noise contribution to an RF sampler using the pulser. For example, a 2 GHz RF sampler using the measured pulse circuit with a PRF of 20 MHz would have a 151 db/Hz phase noise floor. This is comparable to state of the art sources referred to the same frequency.

Although the invention has been described with reference to a particular embodiment thereof, it will be understood to those skilled in the art that the invention is capable of a variety of alternative embodiments within the spirit and scope of the appended claims. For example, this circuit might also find use as a frequency multiplier with output frequencies up to 1 GHz using transistors similar to those used in the test circuit. A large multiplication ratio (5–10) could be obtained in this manner and the circuitry would be simpler than a cascade of frequency doublers.

What is claimed is:

1. A pulse generator circuit comprising:
a signal input terminal,
a signal output terminal,
first, second and third NPN transistors each having a base, an emitter and a collector,
means for coupling the base of said first transistor to said input terminal,
means for coupling the emitter of said first transistor to a negative voltage terminal,
means for coupling the collector of said first transistor to the emitter of said second transistor,
means for coupling the base of said second transistor to a first reference voltage point,
said second transistor having its collector coupled to the base of said third transistor,
an inductor connected between the collector of said second transistor and a first positive voltage terminal,
means for coupling the collector of said third transistor to a second positive voltage terminal,
means for coupling the emitter of said third transistor to a second reference voltage point,
and means for coupling the collector of said third transistor to said output terminal.

2. Apparatus as defined in claim 1 and further including a capacitor connected between the collector of said second transistor and said first positive voltage terminal.

3. Apparatus as defined in claim 2 and further comprising a damping resistor connected between the collector of said second transistor and said first positive voltage terminal.

4. Apparatus as defined in claim 3 and further comprising a semiconductor diode connected between the collector of said second transistor and said first positive voltage terminal.

5. Apparatus as defined in claim 4 wherein said means for coupling the collector of said third transistor to said output terminal includes a capacitor.

6. Apparatus as defined in claim 5 wherein said means for coupling the base of said first transistor to said input terminal includes a transformer.

7. Apparatus as defined in claim 6 wherein said means for coupling the collector of said third transistor to a second positive voltage terminal includes a second inductor.

* * * * *